United States Patent
Haruki

[19]

[11] Patent Number: 6,099,582
[45] Date of Patent: Aug. 8, 2000

[54] AUTOMATIC REVISION OF SEMICONDUCTOR DEVICE LAYOUT FOR SOLVING CONTRADICTION

[75] Inventor: Tamae Haruki, Kawasaki, Japan

[73] Assignee: Fujitsu Limited, Kawasaki, Japan

[21] Appl. No.: 08/922,389

[22] Filed: Sep. 3, 1997

[30] Foreign Application Priority Data

Feb. 24, 1997 [JP] Japan .................................. 9-039491

[51] Int. Cl.[7] ...................................................... G06F 17/50
[52] U.S. Cl. ................................... 716/11; 716/5; 716/21
[58] Field of Search .................................... 364/488, 489, 364/490, 491; 716/11, 5, 21

[56] References Cited

U.S. PATENT DOCUMENTS

| | | | |
|---|---|---|---|
| 5,375,069 | 12/1994 | Satoh et al. ............................. | 364/490 |
| 5,499,331 | 3/1996 | Hayashi et al. ......................... | 395/148 |
| 5,712,794 | 1/1998 | Hong ....................................... | 364/491 |
| 5,787,006 | 7/1998 | Chevallier et al. ..................... | 364/488 |
| 5,828,580 | 10/1998 | Ho .......................................... | 364/489 |

*Primary Examiner*—Paul R. Lintz
*Assistant Examiner*—Vuthe Siek
*Attorney, Agent, or Firm*—Staas & Halsey LLP

[57] ABSTRACT

A method of changing layout of a semiconductor device includes: a step of preparing a physical layout representative of a layout of circuit constituents of a semiconductor device; a step of detecting a contradictory area in the physical layout not conforming with predetermined design rule; a step of converting the physical layout into a graphical representation by extracting nodes such as a transistor and a contact and branches interconnecting nodes from the physical layout; a step of solving the contradictory area in the graphical representation by inserting a new vector into a corresponding branch; and a step of converting the final graphical representation into a new physical representation. The method can automatically solve contradictory areas of a physical layout of a semiconductor device.

28 Claims, 7 Drawing Sheets

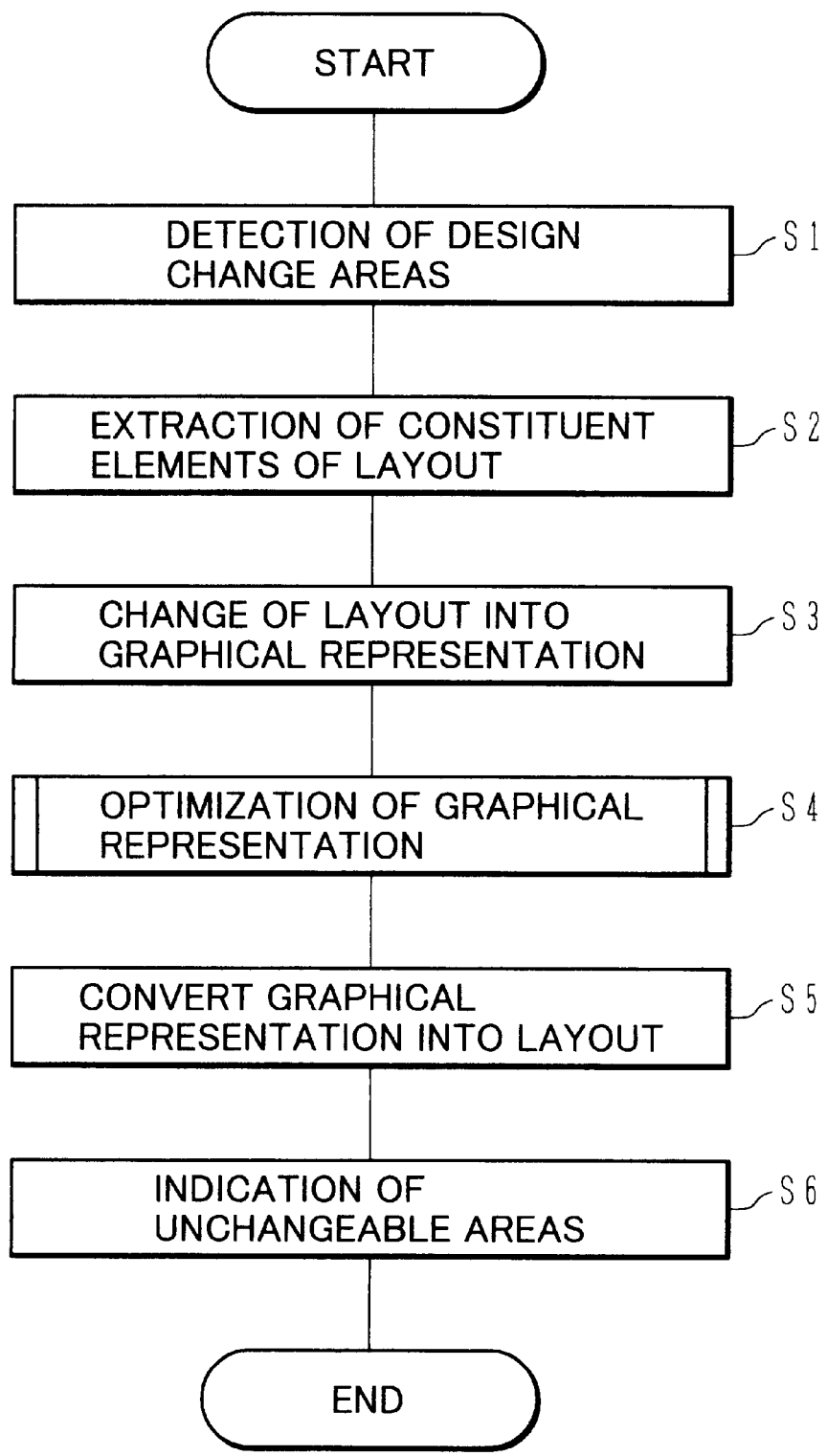

□ : 0
▨ : Π
▧ : CONTRADICTORY AREA

POLYSILICON P
METAL M
DIFFUSION F
CONTACT C

○ NODE N
— BRANCH B

FIG.8A
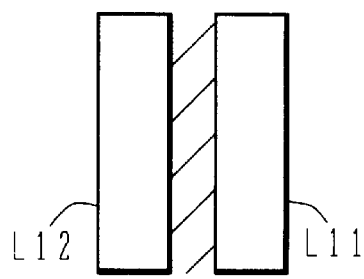
FIG.8B
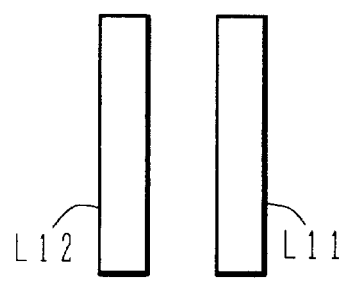
FIG.8C  FIG.8D  FIG.8E  FIG.8F
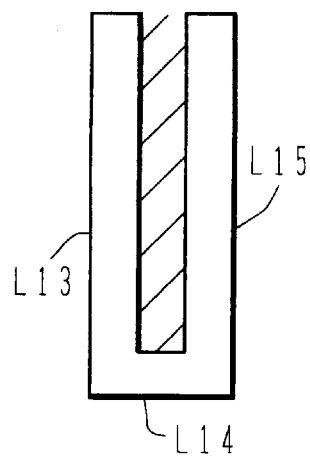 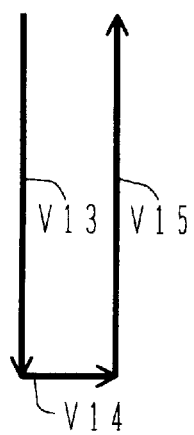 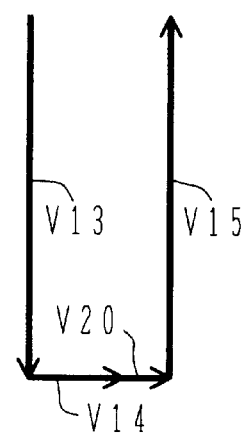 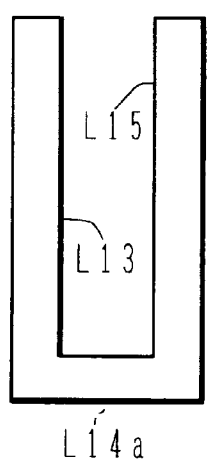

AUTOMATIC REVISION OF SEMICONDUCTOR DEVICE LAYOUT FOR SOLVING CONTRADICTION

This application is based on Japanese Patent Application HEI-9-39491 filed on Feb. 24, 1997, the entire contents of which are incorporated herein by reference.

BACKGROUND OF THE INVENTION a) Field of the Invention

The present invention relates to manufacture of semiconductor devices, particularly to those devices having fine patterns.

b) Description of the Related Art

For the manufacture of semiconductor devices and the like, photolithography techniques are used for transfer a fine pattern on a photomask to a photoresist film. Light diffraction and interference cannot be neglected if a pattern size is near the same order as the wavelength of exposure light. For example, if a distance between adjacent openings becomes short, light fluxes passed through the openings are diffracted and interfered each other. Therefore, the exposure level at a photoresist film is raised at some points in the area corresponding to the area between the adjacent openings and in neighboring areas, so that the adjacent openings cannot be resolved into separate openings.

As one method of solving this problem, a Levenson type phase shift mask has been proposed. This mask uses a phase shifter which gives one of adjacent openings a phase difference of $\pi$ radian to make light fluxes passed through the two adjacent openings have opposite phases. Diffracted and interfered composite light of opposite phases weakens its intensity so that the adjacent openings can be resolved into separate openings.

Levenson type phase shift masks have, however, fatal restrictions. For example, if there are three openings A, B and C and the openings B and C are assigned an inverse phase relative to the opening A, the openings B and C are necessarily assigned the same phase. It is therefore theoretically impossible to make all adjacent openings to be assigned an inverse phase relative to each other.

Design changes of such contradictory areas are therefore necessary. LSI's, especially, have generally a very large number of circuit elements disposed in as small an area as possible. Even one design change affects other circuit areas, and if design changes of a plurality of circuit areas are to be made, an enormous number of design change choices are possible. It is also difficult to predict whether one design change produces better or worse results of the whole circuitry.

If a designer manually makes such design changes, a long time work is required in addition to experiences and knowledge. In order to use a modest tool for semi-automatic design change provided by CAD makers, data required for using it should be prepared beforehand and a number of work processes are also required.

It has been long desired to automatically change designs of contradictory areas of a physical layout of a semiconductor device.

SUMMARY OF THE INVENTION

It is an object of the present invention to provide a layout changing method for semiconductor devices, capable of automatically solving contradictory areas in the physical layout of a semiconductor device.

According to one aspect of the present invention, there is provided a layout changing method for semiconductor devices, comprising the steps of: preparing a physical layout representative of a layout of circuit constituents of a semiconductor device; converting the physical layout into a graphical representation; solving the contradictory area in the graphical representation; and converting the final graphical representation into a new physical representation. The method preferably comprises a further step of detecting a contradictory area in the layout not conforming with a predetermined design rule.

Since a physical layout is directly converted into a graphical representation, design changes can be made automatically without generating additional data. Better layouts can be found by computer simulation or the like. After sufficiently improved results are established, the final graphical representation is converted into a new physical layout.

As above, it is possible to automatically change designs based upon a physical layout.

BRIEF DESCRIPTION OF THE DRAWINGS

FIG. 1 is a flow chart illustrating an automatic design change process according to an embodiment of the invention.

FIGS. 8A to 8F are schematic plan views and line charts explaining wiring optimization.

DETAILED DESCRIPTION OF THE PREFERRED EMBODIMENTS

Embodiments of the invention will be described with reference to the accompanying drawings. In the following, design changes of layouts using Levenson type phase shift masks with shifters are assumed. However, the invention is not limited thereto.

FIG. 1 is a flow chart illustrating the outline of a design changing method for semiconductor devices according to an embodiment of the invention.

It is assumed that layouts of semiconductor devices manufactured by using phase shift masks are formed by CAD or the like. These layouts are preliminary and still have contradictory areas.

At Step S1, a layout is checked in accordance with a predetermined design rule to detect contradictory areas relative to which design changes should be made. The design rule may be such a rule that a distance between a pair of adjacent openings is set to 0.5 $\mu$m or longer for the same phase and to 0.3 $\mu$m or longer for inverse phases. The design rule also restricts the width, space, etc. of a wiring pattern.

With the inspection process at Step S1, all contradictory areas of a physical layout may be picked up for design changes. The inspection process may also be carried out after the conversion to a graphical representation to be described later. Also, the inspection can be done partly before and partly after the conversion to a graphical representation.

Figure 2A:
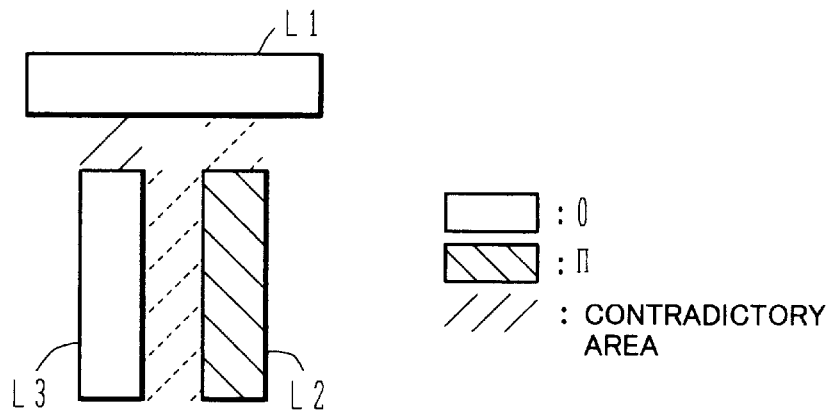
FIGS. 2A to 2C are schematic plan views explaining contradictory areas of physical layouts.
Figure 2B:
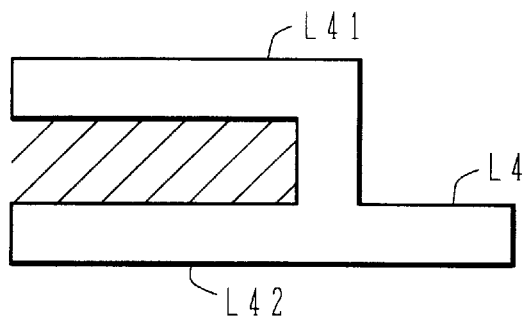
Figure 2C:
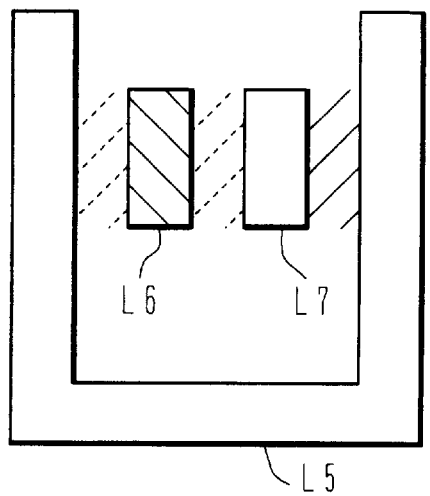

FIGS. 2A to 2C show examples of contradictory areas.

FIG. 2A shows an example of three patterns formed in the same layer. Patterns L2 and L3 are disposed perpendicular to a pattern L1 and parallel to each other. These patterns L1, L2 and L3 are disposed with a shortest distance therebetween, e.g., 0.3 μm.

The pattern L1 is assigned a phase 0 and the pattern L2 is assigned a phase π. In this case, if the pattern L3 is assigned the phase 0, the patterns L2 and L3 form inverse phases, whereas the patterns L1 and L2 form the same phase. An area indicated by solid hatching lines in FIG. 2A becomes an contradictory area for a Levenson type phase mask.

If the pattern L3 is assigned a phase π and the pattern L2 is assigned a phase 0, then an area between the patterns L2 and L1 becomes a contradictory area as partially indicated by broken hatching lines. If the patterns L2 and L3 are assigned the phase π although there is no contradictory area between the pattern L1 and the patterns L2 and L3, the area between the patterns L2 and L3 becomes an contradictory area as partially indicated by broken hatching lines.

In the above example, two patterns L2 and L3 are disposed near one pattern L1. Similar problems occur also when three or more patterns are disposed near one pattern.

It is theoretically impossible to dispose three adjacent patterns to have inverse phases relative to each other. Although patterns having inverse phases can be disposed at a space of 0.3 μm, if they have the same phase, the space of 0.5 μm is required so that design change should be made.

FIG. 2B illustrates another example of a contradictory area formed by a bifurcated pattern. A pattern L4 changes at an intermediate position thereof to a bifurcated pattern including sub-patterns L41 and L42. An area where these sub-patterns L41 and L42 are disposed proximately becomes a contradictory area. The number of branches may be three or more.

FIG. 2C illustrates another example of a contradictory area formed at one of two patterns L6 and L7 disposed between two vertical arms of a U-character shaped pattern L5. A contradictory area is formed between the patterns L5 and L7 if the pattern L5 is assigned a phase 0, the pattern L6 is assigned a phase π, and the pattern L7 is assigned the phase 0.

A contradictory area is also formed between the patterns L5 and L6 if the phases of the patterns L6 and L7 are reversed. This relationship is similar to the example shown in FIG. 2A.

Here, it is assumed that at the step S1 shown in FIG. 1, such contradictory areas of a physical layout are detected and design changes for these areas are to be performed.

At Step S2, constituent elements of the physical layout are first extracted for the preparation of design changes.

Figure 3A:
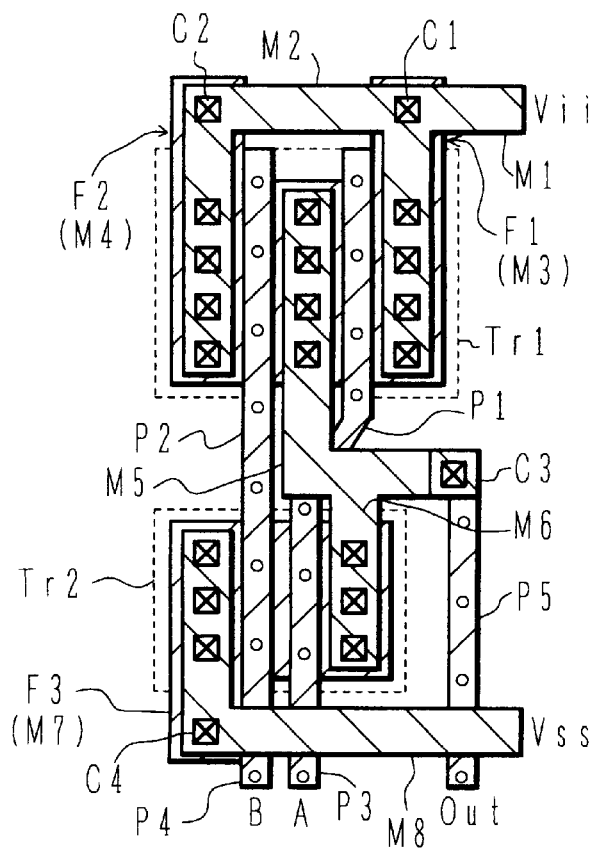
FIGS. 3A to 3C are schematic plan views and an equivalent circuit diagram explaining graphical representation of a physical layout.

FIG. 3A shows an example of a physical layout. A parallel transistor Tr1 is disposed in the upper area of FIG. 3A, and a double-gate transistor Tr2 is disposed in the lower area of FIG. 3A. The transistor Tr1 has a diffusion region constituting a drain region formed in the central area of the transistor Tr1 and diffusion regions constituting two source regions formed on both sides of the drain region, with polysilicon gate electrodes being interposed between the drain region and the source regions.

Two wiring layers are formed over the source and drain regions and electrically connected to the source and drain regions via four contacts per each region. The two source regions connected to one metal wiring layer are guided upward by this wiring layer to be connected via contacts C1 and C2 to a metal wiring layer M2 which extends in a horizontal direction.

The drain region connected to the other metal wiring layer is guided downward and then to the right by this metal wiring layer forming a metal wiring layer M5 to be connected via a contact C3 to a polysilicon electrode P5.

The two gate electrodes of the parallel transistor Tr1 are guided downward and disposed in the area of the transistor Tr2 with a narrower space being set between the two gate electrodes. Diffusion regions constituting a source region and a drain region are formed on both sides of the two gate electrodes. A diffusion region is also formed in the substrate between the two gate electrodes.

The drain region of the transistor Tr2 is connected via three contacts to an upper metal wiring layer M6 which is connected to the metal wiring layer M5 connected to the drain region of the transistor Tr1.

The source diffusion region continuously extends downward to form a diffusion region F3. A metal wiring layer M7 continuing from a metal wiring layer formed above the source diffusion region is disposed above, and connected via a contact C4 to, the diffusion region F3. A metal wiring layer M8 continuous with the metal wiring layer M7 extends from the contact C4 to the right side. The two gate electrodes extend downward under a metal wiring layer M8, forming two polysilicon wiring layers P3 and P4.

Figure 3B:
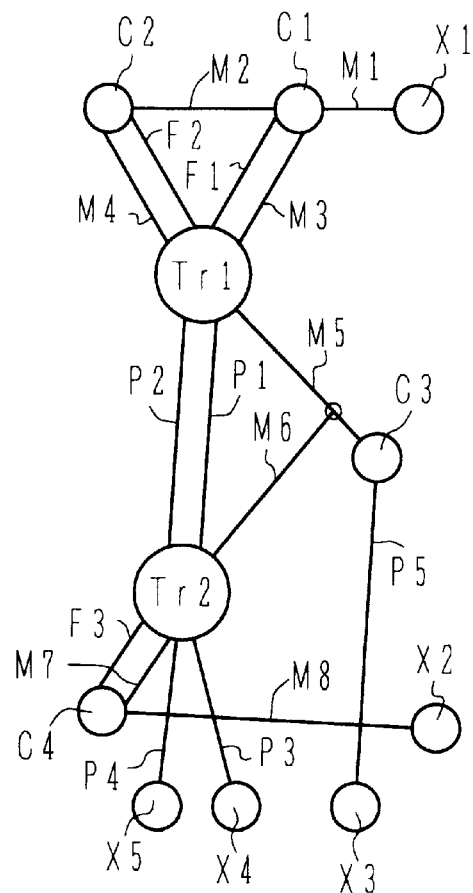

FIG. 3B shows a graphical representation of the layout shown in FIG. 3A. This graphical representation is constituted of nodes each denoted by a circle and branches each denoted by a line segment. The node represents a transistor, a contact, or a wiring terminal point (inclusive of a branching point). Namely, each node represents each constituent of a physical layout, including a circuit element, a contact between different layers, and a wiring terminal point. A circuit element such as a transistor including its internal layer structure and contacts is treated as one node. A wiring which interconnects nodes constitutes a branch.

The graphical representation shown in FIG. 3B can be automatically formed by checking the physical layout shown in FIG. 3A. For example, an area having a polysilicon pattern between diffusion regions is judged to be a transistor Tr node. A contact outside of a transistor area is judged to be a contact node.

A terminal point of a wiring layer outside of a transistor area or a contact area is judged to be a wiring terminal point node. If a wiring pattern includes a branched wiring pattern, this branching point is treated as a wiring terminal point and is virtually discriminated as a node. It is however desired that the branching point is treated differently from other nodes. For example, this branching point is treated as a virtual node discriminable from other usual nodes.

An extracted node is given node information. The node information is, for example, data of coordinate values of an object (transistor, contact, wiring terminal point, etc.) identified by the node and data of branches directly connected to this node. All coordinate values in each node are represented by relative coordinate values using a representative point (e.g., coordinates of center of gravity for the node) as an origin. Information on belonging of each pattern to which layer is important in the case of a Levenson type phase shift mask, etc.

Examples of the data regarding an object identified by a node are the layer of a constituent element and the coordinates of the constituent element. Examples of the data of a branch directly connected to a node are an identifier of a connection point, relative coordinate values of the connection point, and an identifier of the branch.

A branch provides interconnection information between nodes. In addition to information of such as the nodes at both terminal points of a wiring layer and an identifier of each connection point, this branch information includes information of a vector indicating a direction of a wiring pattern (If a wiring pattern changes its direction at an intermediate point, there are a plurality of vectors. The direction of a vector is determined in the manner described later), and information of a width of a wiring layer represented by each vector.

Constituent elements of the physical layout shown in FIG. 3A are extracted and converted into the graphical representation shown in FIG. 3B. Therefore, the physical layout shown in FIG. 3A is equivalent to the graphical representation shown in FIG. 3B in the context of design change. In the graphical representation of FIG. 3B, each branch is shown as a vector having no direction.

Since the graphical representation is equivalent to the physical layout, detection of contradictory areas can be performed on the graphical representation.

Figure 3C:
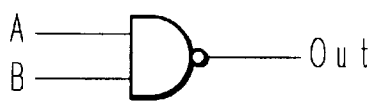

FIG. 3C is an equivalent circuit of the layout and its graphical representation shown in FIGS. 3A and 3B. Those structures shown in FIGS. 3A and 3B are a NAND circuit. An NAND output is formed at an output terminal Out in accordance with two inputs A and B.

In this embodiment, each branch is given a direction for the convenience of design change. Each branch given a direction can be treated as a vector. It is assumed that a start point of a vector is an upstream and an end point is a downstream and that a change in one vector affects downstream elements. This assumption allows the search space to be narrowed.

Figure 4A:
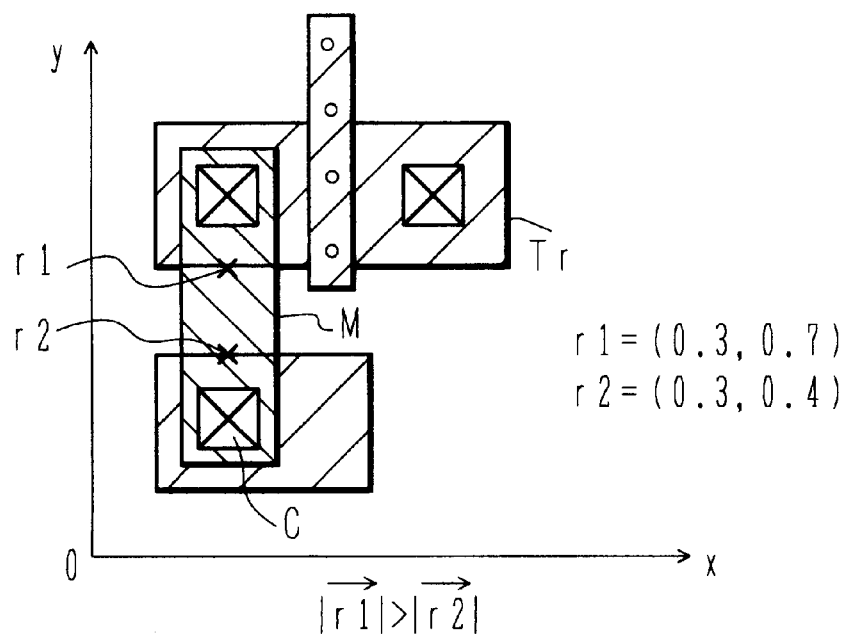
FIGS. 4A to 4C are a schematic plan view and line charts explaining a method of determining a branch direction.

FIG. 4A is a schematic diagram showing an example of a physical layout to be converted into a graphical representation. In this example, transistors Tr, metal wiring layers M, and a contact C are disposed in an x-y coordinate system having an optional origin O. A connection between a metal wiring layer M and a transistor Tr is denoted by a representative point r1=(0.3, 0.7). Similarly, a connection between a metal wiring layer M and a contact C is denoted by a representative point r2=(0.3, 0.4).

Figure 4B:
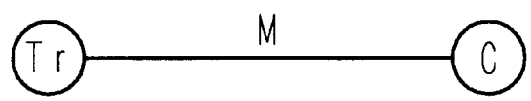

FIG. 4B shows the partial structure of the graphical representation extracted from the physical layout shown in FIG. 4A. A branch of the metal wiring layer M extends between the node representative of the transistor Tr and the node representative of the contact C. The representative points of the connections of the metal wiring layer M to the nodes at both ends are checked as to how far they are positioned from the origin 0. In the exemplary structure shown in FIG. 4A, the magnitude of the vector r1 is large than that of the vector r2.

The direction of a branch is defined for example to direct from the position of the representative point having a smaller vector magnitude to the position of the representative point having a larger vector magnitude. With such a definition rule, the branch M is given a direction from the contact C to the transistor Tr.

Figure 4C:
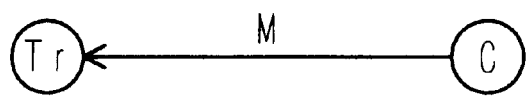

FIG. 4C shows a branch with a direction determined in the above manner. The branch of the metal wiring layer M has a direction from the contact C to the transistor Tr. In the above manner, a direction assignment process of giving each branch a direction is performed.

Figure 5A:
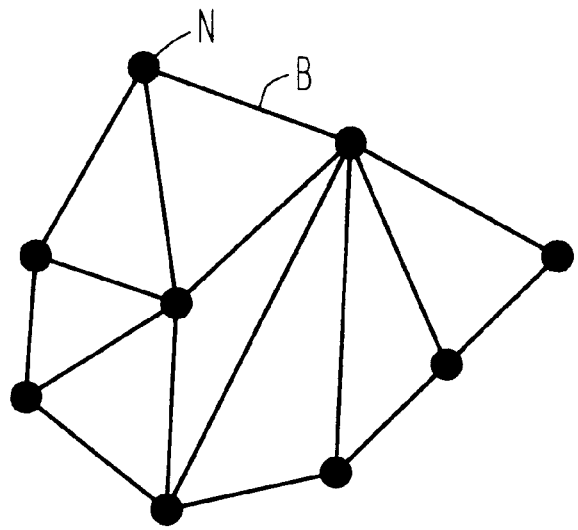
FIGS. 5A and 5B are schematic line charts explaining direction assignment to a graphical representation.
Figure 5B:
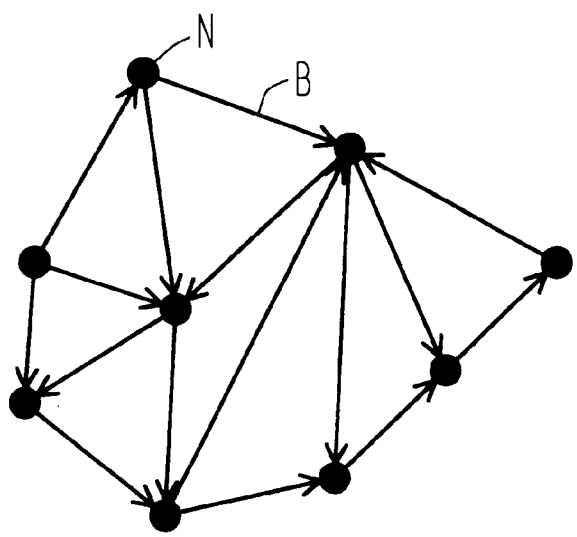

FIGS. 5A and 5B illustrate a direction assignment process for a graphical representation converted from a physical layout. FIG. 5A shows a graphical representation having branches without directions just read from a physical layout. FIG. 5B shows a graphical representation having branches with directions given in accordance with the above definition rule. At Step S3 shown in FIG. 1, each branch is given a direction to form a graphical representation having branches with directions.

Figure 6A:
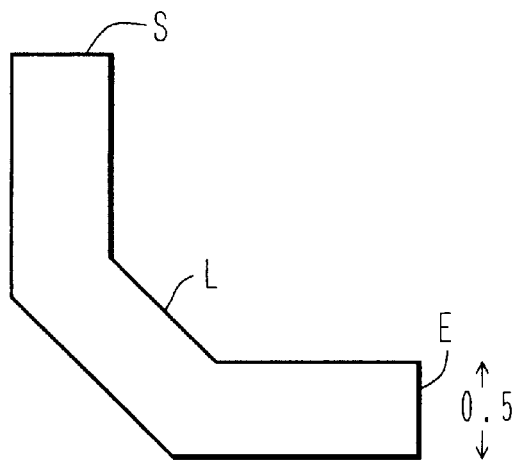
FIGS. 6A and 6B are a schematic plan view and a line chart explaining vector representation of a wiring pattern.
Figure 6B:
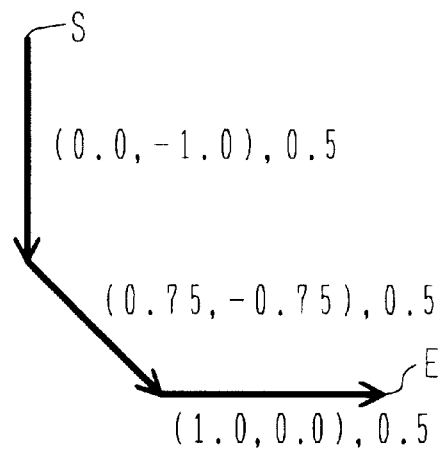

FIGS. 6A and 6B are schematic diagrams illustrating how a wiring layer (branch) is represented by vector notation. FIG. 6A shows an example of a physical layout of a wiring layer. A pattern L of the wiring layer extends downward from the start point S by a predetermined distance, obliquely downward after it is bent by 45 degrees, and horizontally after it is again bent by 45 degrees, and terminates at the end point E. This wiring pattern L has a width of 0.5 $\mu$m over the whole length from the start to end points.

FIG. 6B illustrates how a branch is formed by reading the wiring pattern from the physical layout shown in FIG. 6A. A portion of the wiring pattern extending downward from the start point S has the x-direction position unchanged and the y-direction position changed by −1. Therefore, the vector having a downward direction from the start point S is represented by a vector having a magnitude (including direction) indicated by (0.0, −1.0). The width of 0.5 $\mu$m of this portion of the wiring pattern is given as wiring information.

An intermediate portion of the wiring pattern extending to the lower right has the x-direction position changed by 0.75 and the y-direction position changed by −0.75. Therefore, this vector is represented by a vector having a magnitude (including direction) indicated by (0.75, −0.75), with the width of 0.5 $\mu$m being given as wiring information. Similarly, a portion between the intermediate portion and the end point E is represented by a vector having a magnitude (including direction) indicated by (1.0, 0.0), with the width of 0.5 $\mu$m being given as wiring information.

With the above preparatory processes, the physical layout is converted into a graphical representation having branches with directions to complete the preparation for design changes.

It may be noted that the detection of contradictory areas, if any, can be done at any timing up to this point. Alternatively, the detection of contradictory areas can be dispensed with, provided that each layout can be evaluated, as described later.

Next, at Step S4 an optimization process for the graphical representation is executed. An example of this process will be later described. A graphical representation optimization process means a process of reducing the number of contradictory areas in the physical layout converted into the graphical representation, and does not necessarily mean a process of solving all contradictory areas.

At Step S5 the optimized graphical representation is converted into a new physical layout. Namely, after the graphical representation is optimized, it is again converted into a new physical layout.

At Step S6, contradictory areas not solved by the graphical representation optimization, i.e., those areas unable to be changed, are indicated or displayed. Only after this process, manual design changes start.

Next, the optimization process for a graphical representation at Step S4 will be described.

First, contradictory areas in each node are solved. This solution to contradictory areas in a node has already been verified theoretically.

Figure 7A:
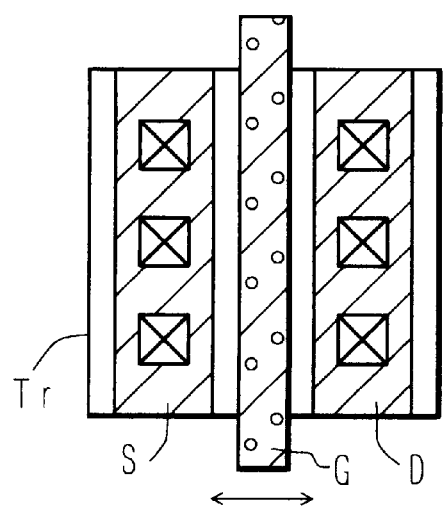
FIGS. 7A and 7B are schematic plan views explaining solution of contradictory areas in a node.
Figure 7B:
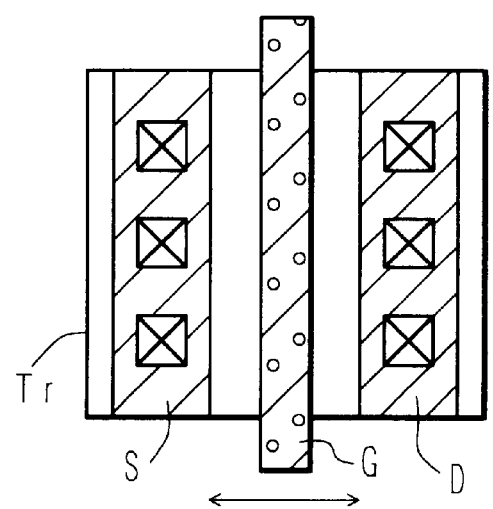

FIGS. 7A and 7B illustrate an example of how contradictory areas of a transistor are solved. FIG. 7A shows a contradictory area caused by too proximate layout of a source S and a drain D.

FIG. 7B shows an example of the structure of the transistor whose contradictory area was solved. In this example, the contradiction is solved by setting a longer distance between the source S and drain D. A physical layout free of such contradiction may be formed at an initial stage by using a proper design rule. Contradictory areas of other nodes are also solved by similar manners.

After contradictory areas in nodes are solved, contradictory areas of branches between the nodes are solved. Not all the contradictory areas are solved by this process only. The graphical representation may be divided into small areas according to necessity, to solve contradictory areas in each divided small area.

The following evaluation criteria are used when the graphical representation of a physical layout is changed to solve contradictory areas:

1) the changed graphical representation must satisfy design rules;
2) the changed graphical representation must preserve the original interconnection information;
3) the changed graphical representation must preserve the original gate length and width of a transistor at a transistor node;
4) the changed graphical representation should preserve the original positional relationship between the source and drain of a transistor as much as possible;
5) the changed graphical representation should preserve the original positional relationship between the original length of a branch as much as possible;
6) the changed graphical representation should preserve the original width of a branch as much as possible; and
7) the changed graphical representation should preserve the original coordinate values of terminal points in a unit design change area as much as possible.

Of the above criteria, the criteria 1) to 3) (with "must") are bound to be obeyed by all means. The criteria 4) to 7) (with "should . . . as much as possible") are preferable to be obeyed if possible. It is preferable to calculate an error value in accordance with a predetermined evaluation standard if one of these criteria is not obeyed. Of the branches indicating wiring layers, a branch of polysilicon and a branch of metal may be evaluated differently.

A trial for solving one problematic area may produce another problem. Detection of contradictory area may also be done in such try-and-error process. Alternatively, some evaluation, such as a sum of error values, may be employed without positively detecting respective contradictory areas. The following description is made on the assumption that contradictory areas are detected before design change and evaluation standard may additionally employed.

FIGS. 8A to 8F are schematic diagrams illustrating a wiring branch optimization process. First, the width of each branch represented by a vector is adjusted in the allowable range of the design rule to remove those contradictory areas which can be solved by changing the branch width.

FIGS. 8A and 8B are schematic diagrams illustrating such a contradiction solving process. In FIG. 8A, patterns L11 and L12 are disposed too near and the area therebetween becomes a contradictory area.

As shown in FIG. 8B, the widths of the patterns L11 and L12 are narrowed in the allowable range of the design rule.

If the contradictory area is removed by narrowing the widths of the patterns, the solution results are adopted. However, the widths of wiring patterns cannot be made too thin and are required to have a predetermined width or wider. There is therefore some limitations on the number of contradictory areas to be solved by such a process.

After contradictory areas which can be solved by changing widths are removed, a process of adding a new vector is executed in order to solve still remaining contradictory areas. The direction of a vector permitted to use is determined in the allowable range of the design rule. For example, only the vectors in the x- and y-directions, a vector in a 45-degree direction, a vector in an omni-direction, etc. is permitted to use.

FIGS. 8C to 8F are schematic diagrams illustrating a process of solving contradictory areas by inserting new vectors.

FIG. 8C shows an example of the structure of a layout of a branch which has a contradictory area. Patterns L13, L14 and L15 form a continuous one wiring pattern. The patterns L13 and L15 are disposed too near so that there is a contradictory area therebetween.

FIG. 8D shows a graphical representation of the physical layout shown in FIG. 8C. Vectors V13 to V15 are formed in correspondence with the patterns L13 to L15.

FIG. 8E shows a new vector V20 inserted between the vectors V14 and V15 of the graphical representation shown in FIG. 8D. The start point of the vector V20 is connected to the end point of the vector V14, and the end point of the vector V20 is connected to the start point of the next vector V15. Therefore, the vector V15 is shifted to the right. If the vector V20 has a direction opposite to that of the vector V14, the vector V15 is shifted to the left.

FIG. 8F shows a new physical layout converted from the graphical representation shown in FIG. 8E. The pattern L13 corresponding to the vector V13 is the same as that shown in FIG. 8C. A pattern L14a is represented by a sum of the vectors V14 and V20 shown in FIG. 8E and has a magnitude larger than that of the pattern L14 shown in FIG. 8C. Therefore, the pattern L15 connected to the pattern L14a is moved away from the pattern L13. Insertion of such a vector makes the patterns L13 and L15 be positioned more remotely so that the contradictory area can be solved.

An operation illustrated in FIGS. 8C to 8F is a very simple example. Not all contradictory areas in an LSI layout are solved by such a simple operation. The process of solving a contradictory area by inserting a new vector into a branch will be detailed hereinafter.

First, it is assumed that contradictory areas which can be solved by changing the widths of branches are all solved and removed. This state is set as an initial condition. Contradictory areas not solved yet under the initial condition are treated as errors. These errors are quantified in accordance with predetermined standard. The value of each error is calculated by the predetermined standard such as the criteria 1) to 7).

First, an objective function of the initial condition is calculated. The objective function O is defined as a total sum of error values E by the following equation:

$$O(Xi) = \Sigma E(n)$$

where Xi indicates one physical layout and O indicates the objective function. E(n) indicates a value of each error n contained in one physical layout. Each error corresponds to a contradictory area requiring design change.

It will be apparent that if an evaluation standard such as the above-mentioned objective function can be provided, detection of respective contradictory areas may be dispensed with.

Genetic algorithms are adopted for the optimization of a graphical representation. Using a graphical representation of the initial condition (initial values) as parents, children are generated through mutation. Specifically, in order to eliminate an error of an optional design change area n, an adequate vector is inserted into a branch at the design change area n or at an area more upstream than this area n. In this manner, k children are generated from the graphical representation of the initial values.

After the k children are generated, children of the next generation are further generated through crossover and mutation.

Crossover is an operation of forming a new chromosome by cutting a chromosome (layout) Xi of an individual i and another chromosome Xj of another individual j at the same portion (or position) and forming a combination of different cut portions, or by using an average of the chromosomes of the two individuals.

Mutation may use the following methods.

Heuristic method:
1) In order to eliminate an error of a design change area in the most excellent chromosome of a subject generation, all branches relevant to a subject node are checked as to into which branch a new vector is inserted. This operation is executed for each of all design change areas.
2) A design change which empirically produces good results is executed. For example, if there is no layout area on one outer side of a subject layout, the pattern of the subject layout is broadened to the one outer side.

Such genetic algorithms of generating the next generation result in an enormous number of individuals. In order to reduce the number of individuals, a fitness function can be used.

A fitness function F(Xi) relative to the objective function O (Xi) is defined by the following equation:

$$F(Xi)=O(XO)/[O(Xi)+\epsilon]$$

where O (XO) is an initial value, $\epsilon$ is a small value used for preventing an overflow when O (Xi) becomes 0.

The fitness function is not limited to the above. This fitness function is, however, most suitable for observing a change in the fitness function to be caused by a change in the objective function, at high sensitivity but not at too high sensitivity.

For carrying out crossover or the like, a possibility P(Xi) of selecting an individual Xi may be set by the following equation:

$$P(Xi)=F(Xi)^a/\Sigma F(Xi)^a$$

This is an exaggeration type roulette wheel method by which parameters of parents to be selected for crossover or the like can be changed by an exaggeration factor a.

For example, it is empirically known that a superior individual of the next generation can be obtained by selecting a very superior individual as one of parents and a relatively mediocre individual as the other. Such a selection becomes possible by using the exaggeration factor. If a =1, a normal proportional relation is set, if 1<a, individuals are exaggerated, and if 1>a, a selection becomes almost random.

By using the fitness function, only those individuals superior to parents are selected to generate individuals of the next generation. By using similar genetic approaches, individuals of the second next generation are generated. It is preferably to set the number of individuals of the same generation to a constant value, excepting the initial value. If all design change areas are solved by such genetic operations, alteration of generations is stopped. If the fitness function of the most superior individual is not renewed even if alteration of generations is performed a predetermined number of times, alteration of generations is also stopped. The number of generations when generation alteration is stopped may be determined basing upon the number of nodes, etc. For such genetic operations, reference is made to, for example, Japanese Patent Laid-open Publication No. HEI-4-395687 (U.S. Pat. No. 5,415,952) which is incorporated herein by reference.

A Levenson type phase shift mask has been used illustratively in the above description. It is obvious to those skilled in the art that layouts of other mask types may be used for automatic design change by the above-described method.

The present invention has been described in connection with the preferred embodiments. The invention is not limited only to the above embodiments. It will be apparent to those skilled in the art that various modifications, improvements, combinations, and the like can be made.

What is claimed is:

1. A method of changing layout of a semiconductor device, comprising the steps of:
   a) preparing a physical layout representative of a layout of circuit constituents of a semiconductor device to be realized with use of a Levenson type phase shift mask;
   b) detecting a contradictory area in the layout not conforming with predetermined design rules, said rules including rules for a same phase and rules for a reverse phase;
   c) converting the physical layout into a graphical representation including:
      c-1) detecting nodes and branches interconnecting the detected nodes from the physical layout, where each node represents a circuit element, a contact outside of the circuit element, a branching point of a wiring layer, or a terminal point of a wiring layer;
      c-2) converting the nodes and the branches into the graphical representation;
   d) solving the contradictory area in the graphical representation; and
   e) converting the graphical representation into a new physical representation.

2. A method of changing layout of a semiconductor device according to claim 1, wherein said step b utilizes the physical layout.

3. A method of changing layout of a semiconductor device according to claim 1, wherein said step b utilizes the graphical representation.

4. A method of changing layout of a semiconductor device according to claim 1, wherein said step d comprises:
   d-1) firstly solving a contradictory area in the nodes of the graphical representation; and
   d-2) secondly solving a contradictory area in the branches of the graphical representation.

5. A method of changing layout of a semiconductor device according to claim 4, wherein said step c further comprises:
   c-3) providing sense information to each branch in accordance with the predetermined design rule.

6. A method of changing layout of a semiconductor device according to claim 5, wherein said step d-2 includes a step of inserting a vector to one of the branches.

7. A method of changing layout of a semiconductor device according to claim 5, wherein said step d-2 includes a step of generating a graphical representation from two graphical representations.

8. A method of changing layout of a semiconductor device according to claim 7, wherein said step of generating a graphical representation from two graphical representations includes a step of dividing each of the two graphical representations at a common portion or position and combining a portion of one graphical representation with a different portion of the other graphical representation.

9. A method of changing layout of a semiconductor device according to claim 7, wherein said step of generating a graphical representation from two graphical representations includes a step of averaging corresponding branches of the two graphical representations.

10. A method of changing layout of a semiconductor device, comprising the steps of:
 a) preparing a physical layout representative of a layout of circuit constituents of a semiconductor device;
 b) converting the physical layout into a graphical representation including:
  b-1) detecting nodes and branches interconnecting the detected nodes from the physical layout, where each node represents a circuit element, a contact outside of the circuit element, a branching point of a wiring layer, or a terminal point of a wiring layer;
  b-2) converting the nodes and the branches into the graphical representation;
 c) detecting a contradictory area in the layout not conforming with a predetermined design rule;
 d) optimizing the layout in the graphical representation; and
 e) converting the final graphical representation into a new physical representation.

11. A method of changing layout of a semiconductor device according to claim 10, wherein said step c utilizes the physical layout.

12. A method of changing layout of a semiconductor device according to claim 10, wherein said step c utilizes the graphical representation.

13. A method of changing layout of a semiconductor device according to claim 10, wherein said step b further comprises:
 b-3) providing sense information to each branch in accordance with the predetermined design rule.

14. A method of changing layout of a semiconductor device according to claim 10, wherein said step d utilizes evaluation of the graphical representation.

15. A method of changing layout of a semiconductor device according to claim 14, wherein said step d includes summing error functions of constituent elements of the graphical representation.

16. A method of changing layout of a semiconductor device according to claim 15, wherein said step d includes a step of generating a graphical representation from two graphical representations.

17. A method of changing layout of a semiconductor device according to claim 16, wherein said step d further includes a step of dividing each of the two graphical representations at a common portion or position and combining a portion of one graphical representation with a different portion of the other graphical representation.

18. A method of changing layout of a semiconductor device according to claim 16, wherein said step d further includes a step of averaging corresponding branches of the two graphical representations.

19. A method of changing a layout of a semiconductor device according to claim 15, wherein said step d includes generating children graphic representations by genetic algorithms.

20. A method of changing layout of a semiconductor device, comprising the steps of:
 a) preparing a physical layout representative of a layout of circuit constituents of a semiconductor device;
 b) converting the physical layout into a graphical representation including:
  b-1) detecting nodes and branches interconnecting the detected nodes, from the physical layout, where each node represents a circuit element, a contact outside of the circuit element, a branching point of a wiring layer, or a terminal point of a wiring layer;
  b-2) converting the nodes and the branches into the graphical representation;
 c) providing error functions to each constituent element of the graphical representation;
 d) optimizing the layout in the graphical representation by use of genetic algorithms and sum of error functions; and
 e) converting the graphical representation into a new physical representation.

21. A method of changing layout of a semiconductor device according to claim 20, further comprising the step of:
 f) detecting a contradictory area in the layout not conforming with the predetermined design rule.

22. A method of changing layout of a semiconductor device according to claim 20, wherein said step b further comprises:
 b-3) providing sense information to each branch in accordance with the predetermined design rule.

23. A method of changing layout of a semiconductor device according to claim 22, wherein said step d includes inserting a vector in the graphical representation and renewing error functions.

24. A method of changing layout of a semiconductor device according to claim 22, wherein said step d includes a step of generating a graphical representation from two graphical representations.

25. A method of changing layout of a semiconductor device according to claim 24, wherein said step d further includes a step of dividing each of the two graphical representations at a common portion or position and combining a portion of one graphical representation with a different portion of the other graphical representation.

26. A method of changing layout of a semiconductor device according to claim 24, wherein said step d further includes a step of averaging corresponding branches of the two graphical representations.

27. A method of changing the layout of a semiconductor device according to claim 20, wherein said step d generates children of graphic representations by the genetic algorithms and keeps those children of smaller sum of error functions.

28. A method of changing the layout of a semiconductor device, comprising:
 preparing a physical layout of a semiconductor device using a phase shift mask;
 detecting an area in the physical layout which does not conform with predetermined design rules;
 converting the physical layout to a graphical layout, including:
  detecting nodes and branches, the nodes being representative of a circuit element, a contact outside the circuit element, a branching point of a wiring layer, or a terminal point of a wiring layer;
  converting the nodes and branches into the graphical layout;
 optimizing the graphical layout according to the predetermined design rules; and
 converting the optimized graphical layout into a new physical layout.

* * * * *